(12) United States Patent
Penning et al.

(10) Patent No.: US 9,460,875 B2
(45) Date of Patent: Oct. 4, 2016

(54) MAGNETIC SWITCH ACTUATORS

(71) Applicant: GENERAL EQUIPMENT AND MANUFACTURING COMPANY, INC., Louisville, KY (US)

(72) Inventors: Bruce Robert Penning, Louisville, KY (US); Robert Lynn LaFountain, Charlestown, IN (US); Michael John Simmons, Louisville, KY (US)

(73) Assignee: GENERAL EQUIPMENT AND MANUFACTURING COMPANY, INC., Louisville, KY (US)

( * ) Notice: Subject to any disclaimer, the term of this patent is extended or adjusted under 35 U.S.C. 154(b) by 169 days.

(21) Appl. No.: 13/759,779

(22) Filed: Feb. 5, 2013

(65) Prior Publication Data

US 2013/0300524 A1 Nov. 14, 2013

(30) Foreign Application Priority Data

May 14, 2012 (CN) .......................... 2012 2 0222096

(51) Int. Cl.
| | |
|---|---|
| *H01H 9/00* | (2006.01) |
| *H01H 36/00* | (2006.01) |
| *H03K 17/97* | (2006.01) |
| *H01H 3/16* | (2006.01) |

(52) U.S. Cl.
CPC ......... *H01H 36/0073* (2013.01); *H01H 36/00* (2013.01); *H03K 17/97* (2013.01); *H01H 3/16* (2013.01)

(58) Field of Classification Search
CPC .... H01H 36/00; H01H 3/16; H01H 36/0073; H01H 36/008; H03K 17/97

USPC .................................................. 335/205–207
See application file for complete search history.

(56) References Cited

U.S. PATENT DOCUMENTS

| | | | | |
|---|---|---|---|---|
| 3,260,821 | A | * | 7/1966 | Yokoo ........................... 335/207 |
| 4,150,350 | A | * | 4/1979 | Fong ............................. 335/205 |
| 5,877,664 | A | * | 3/1999 | Jackson, Jr. ................... 335/205 |
| 6,060,969 | A | * | 5/2000 | Hufgard et al. .............. 335/207 |
| 7,750,771 | B2 | * | 7/2010 | Yamada et al. ............... 335/205 |
| 8,264,309 | B2 | | 9/2012 | Lafountain et al. |

(Continued)

FOREIGN PATENT DOCUMENTS

| | | |
|---|---|---|
| CN | 201163598 | 12/2008 |
| CN | 201449937 | 5/2010 |

(Continued)

OTHER PUBLICATIONS

International Searching Authority, "International Search Report," issued in connection with PCT Application No. PCT/US2013/040462, Aug. 26, 2013, 3 pages.

(Continued)

*Primary Examiner* — Bernard Rojas
(74) *Attorney, Agent, or Firm* — Hanley, Flight & Zimmerman, LLC (57) ABSTRACT

Magnetic switches are disclosed herein. An example apparatus includes a mount and a switch actuator assembly coupled to the mount. The switch actuator assembly includes a body, a trigger, and a first magnet oriented to be attracted to a second magnet. Movement of the body from a first position to a second position is to cause relative movement between the first magnet and the second magnet and relative movement between the trigger and a switch.

20 Claims, 6 Drawing Sheets

(56) References Cited

U.S. PATENT DOCUMENTS 8,362,859 B2 1/2013 Pearce et al.
8,400,241 B2 3/2013 Simmons

FOREIGN PATENT DOCUMENTS

GB 1227835 4/1971

JP S4848971 7/1973

OTHER PUBLICATIONS

International Searching Authority, "Written Opinion of the International Searching Authority," issued in connection with PCT Application No. PCT/US2013/040462, Aug. 26, 2013, 6 pages.

* cited by examiner

FIG. 7

MAGNETIC SWITCH ACTUATORS

RELATED APPLICATIONS

This patent claims priority from Chinese Patent Application Serial Number 201220222096.2, entitled "Magnetic Switch Actuators," which was filed on May 14, 2012, and is hereby incorporated by reference in its entirety.

FIELD OF THE DISCLOSURE

This disclosure relates generally to switches and, more particularly, to magnetic switch actuators.

BACKGROUND

A switch often includes an actuator such as a button or a lever. Typically, a portion of the actuator is conductive. When the actuator is moved from a first position to a second position, the conductive portion of the actuator generally engages (i.e., closes) or disengages (i.e., opens) one or more sets of electrical contacts. In some switches, a spring moves the actuator back to the first position to reset the switch.

SUMMARY

An example apparatus includes a mount including a first magnet and a body movably coupled to the mount. The body includes a second magnet. The example apparatus also includes a trigger movable with the body. The first magnet and the second magnet urge the body toward a first position, and movement of the body from the first position to a second position is to cause the trigger to actuate a switch via a magnetic field.

Another example apparatus includes a mount and a switch actuator assembly coupled to the mount. The switch actuator assembly includes a body, a trigger, and a first magnet oriented to be attracted to a second magnet. Movement of the body from a first position to a second position is to cause relative movement between the first magnet and the second magnet and relative movement between the trigger and a switch.

Another example apparatus includes means for actuating movably coupled to means for mounting the means for actuating. The means for mounting includes first means for magnetically urging the means for actuating, and the means for actuating includes second means for magnetically urging the means for actuating. The example apparatus also includes means for magnetically actuating a switch movable with the means for actuating. The first means for magnetically urging and the second means for magnetically urging urge the means for actuating toward a first position, and movement of the means for actuating from the first position to a second position is to cause the means for magnetically actuating the switch to actuate the switch via a magnetic field.

DETAILED DESCRIPTION

A switch often includes a switch actuator (e.g., a button, a lever, etc.) coupled to a spring. A portion of the switch actuator may be conductive. When the switch actuator is moved from a first position to a second position, the conductive portion may engage (i.e., close) one or more sets of electrical contacts or disengage (i.e., open) the one or more sets of electrical contacts, thereby actuating the switch. The spring may then reset the switch by moving the switch actuator back to the first position. However, the spring may fatigue and fail. Also, the switch may be subjected to corrosive conditions. As a result, the contacts may corrode and/or oxidize, thereby causing the switch to fail.

Example apparatus disclosed herein may be used to actuate a switch via a magnetic field without mechanically contacting the switch. The example apparatus disclosed herein may physically partition or separate a switch actuator assembly from the switch, thereby enabling the switch to be segregated or isolated from a corrosive environment to which the switch actuator assembly may be exposed. The example apparatus disclosed herein include a mount including a first magnet and a body movably coupled to the mount. The body includes a second magnet. The example apparatus also include a trigger movable with the body. In some examples, the body is a lever and a cam, and the trigger is movable with the body via a follower adjacent the cam. In other examples, the body is elongated and the trigger is disposed along a length of the body. The first magnet and the second magnet urge the body toward a first position, and movement of the body from the first position to a second position is to cause the trigger to actuate the switch via a magnetic field. The movement of the body from the first position to the second position is to cause relative movement between the first magnet and the second magnet and relative movement between the trigger and the switch. In some examples, the mount partitions the body from the switch.

Figure 1:
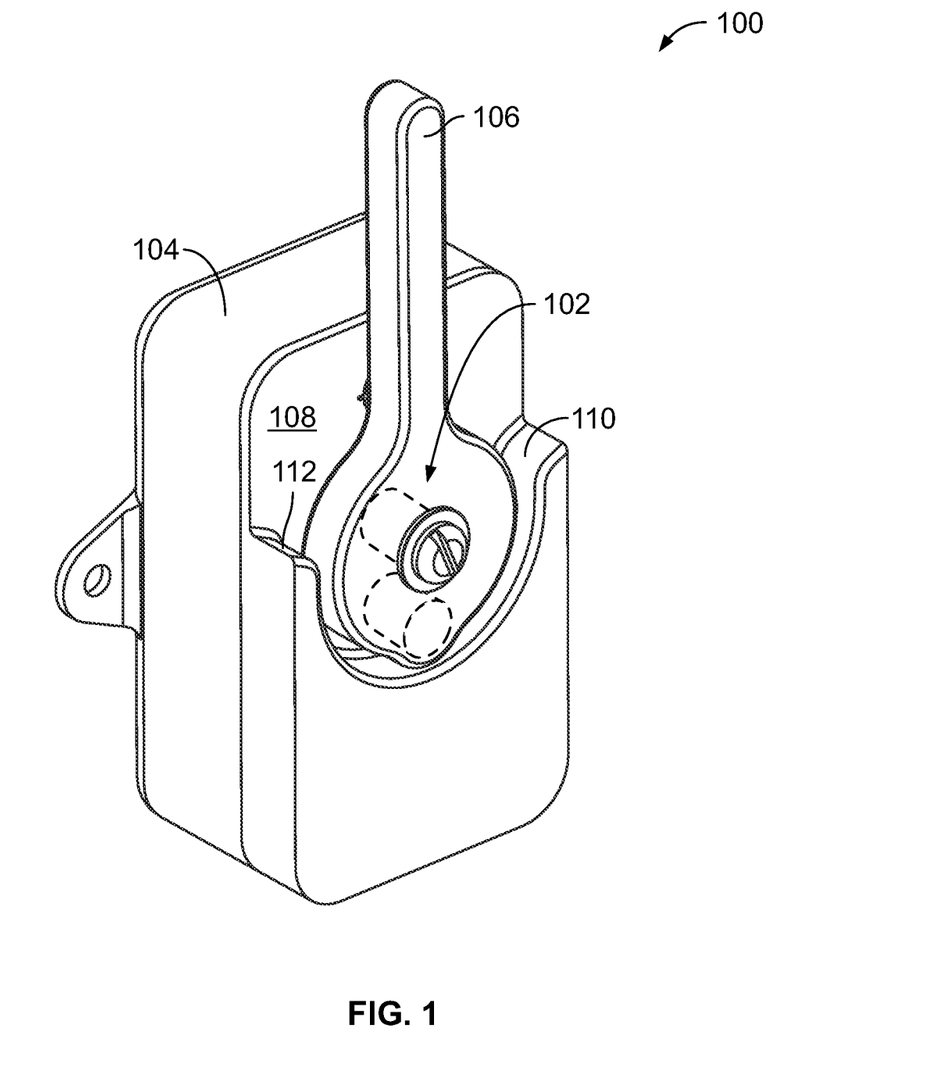
FIG. 1 illustrates an example apparatus disclosed herein.

FIG. 1 illustrates an example apparatus 100 disclosed herein. The example apparatus 100 includes a switch actuator assembly 102 coupled to a mount 104. The switch actuator assembly 102 includes a body 106. In the illustrated example, the body 106 is elongated, and the body 106 is rotatably coupled to an exterior face 108 of the mount 104. In some examples, the body 106 is slidably coupled to the exterior face 108 of the mount 104. The example mount 104 illustrated in FIG. 1 includes protrusions or stop surfaces 110 and 112 adjacent the body 106 to limit movement of the body 106.

In the illustrated example of FIG. 1, the body 106 is in a first position. The body 106 is movable from the first position in a first direction or a second direction opposite the first direction. The mount 104 and the body 106 are non-magnetic (e.g., plastic, ceramic, etc.). As described in greater detail below in connection with FIG. 2, when the body 106 moves from the first position to a second position, a trigger 200 actuates a switch 210 via a magnetic field.

Figure 2:
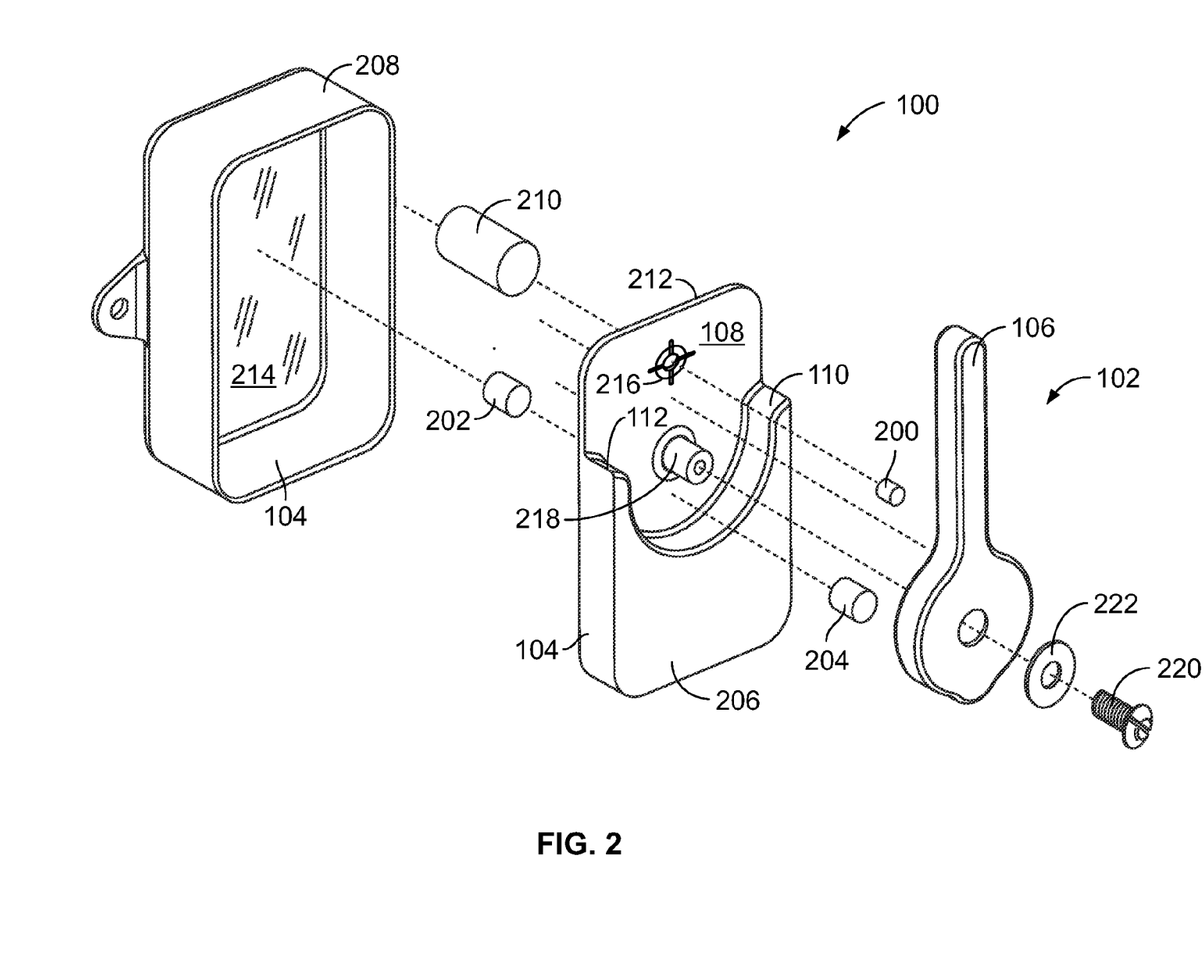
FIG. 2 depicts an exploded view of the example apparatus of FIG. 1.

FIG. 2 depicts an exploded view of the example apparatus 100 of FIG. 1. The example switch actuator assembly 102 also includes the trigger 200, a first magnet 202 (e.g., a samarium-cobalt magnet, a neodymium magnet, etc.), and a second magnet 204 (e.g., a samarium-cobalt magnet, a neodymium magnet, etc.). In the illustrated example, the mount 104 includes a cover 206 and a base 208 to enclose the first magnet 202 and the switch 210 (e.g., a TopWorx GO® Switch, an inductive proximity switch, etc.). The first magnet 202 and the switch 210 are coupled to an interior surface 212 of the cover 206 and/or an interior surface 214 of base 208. Thus, the mount 104 partitions (e.g., physically isolates or separates) the body 106 from the switch 210. In some examples, the switch 210 includes a proximity sensor. In the illustrated example, the exterior face 108 of the cover 206 includes a visual indicator 216 adjacent the switch 210. Also, the body 106 is mounted on a fulcrum or pivot 218 extending from the exterior face 108 of the cover 206. The body 106 is fastened or secured to the fulcrum or pivot 218 via, for example, a screw 220 and a washer 222. In some examples, the cover 206 and the base 208 are hermetically sealed to isolate the switch 210 from an ambient environment surrounding the example apparatus 100 and, thus, the actuator assembly 102.

The body 106 includes the second magnet 204 and the trigger 200. The trigger 200 is magnetic and/or ferrous. The second magnet 204 and the trigger 200 are disposed along a length of the body 106. In some examples, the trigger 200 and/or the second magnet 204 are coupled to an exterior surface of the body 106. In other examples, the trigger 200 and/or the second magnet 204 are disposed inside the body 106. In the illustrated example, the trigger 200 and the second magnet 204 are disposed in recesses (not shown) of the body 106.

Figures 3, 4:
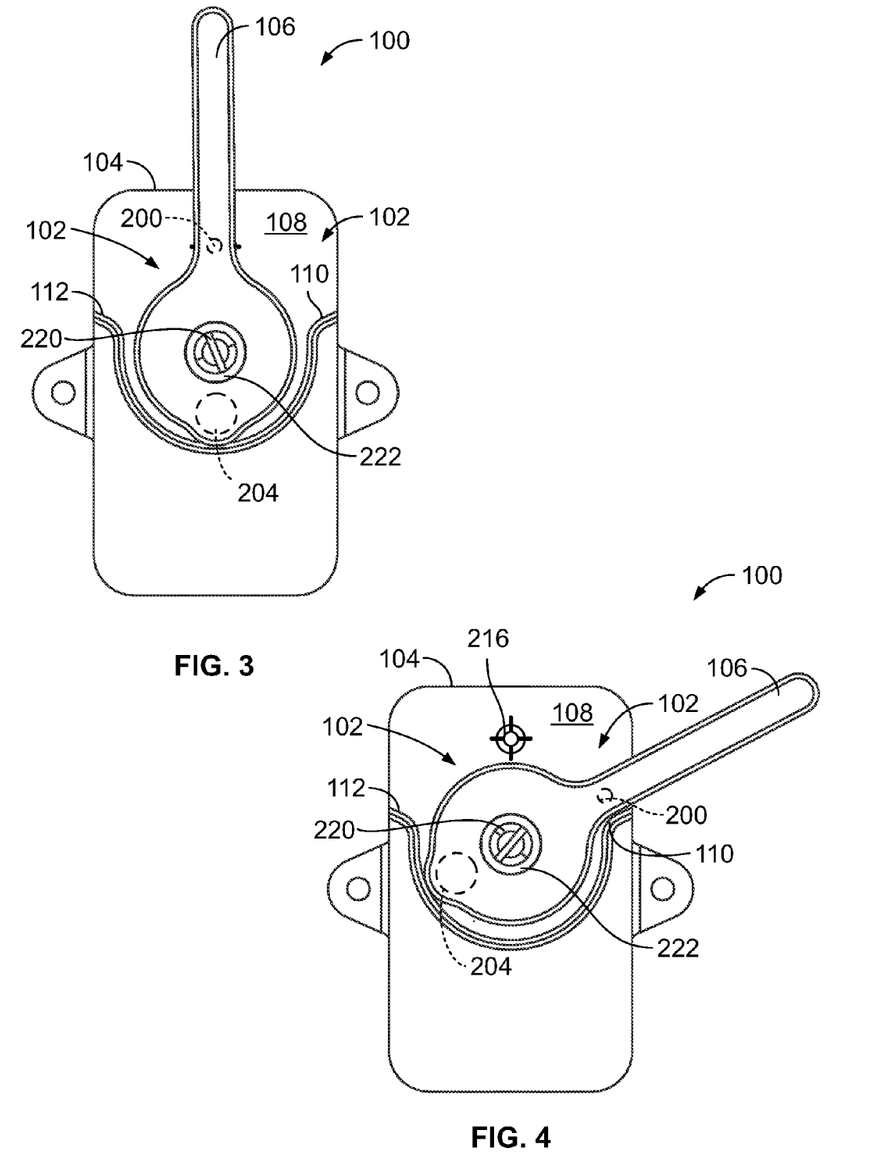
FIG. 3 illustrates the example apparatus of FIG. 1 in a first position.
FIG. 4 illustrates the example apparatus of FIG. 1 in a second position.

FIG. 3. Illustrates the body 106 of the switch actuator assembly 102 in the first position. In the illustrated example, when the body 106 is in the first position, the switch 210 and the trigger 200 are substantially aligned and the first magnet 202 and the second magnet 204 are substantially aligned. The first magnet 202 is oriented to be attracted to the second magnet 204 (e.g., a north pole of the first magnet 202 is adjacent the cover 206 and a south pole of the second magnet 204 is adjacent the cover). Thus, the first magnet 202 and the second magnet 204 urge the body 106 toward the first position.

In the illustrated example, when the body 106 is in the first position, the trigger 200 causes the switch 210 to be in an open state or a closed state via a magnetic field provided by the trigger 200 and/or the switch 210. In some examples, the switch 210 and the trigger 200 are not substantially aligned when the body 106 is in the first position, and the trigger 200 does not cause the switch 210 to be in an open state or a closed state when the body 106 is in the first position.

FIG. 4 illustrates the body 106 in the second position. Movement of the body 106 causes relative movement between the trigger 200 and the switch 210. The body 106 may rotate in the first direction or the second direction opposite the first direction. When the body 106 moves from the first position to the second position, the trigger 200 moves with the body 106 away from the switch 210, thereby causing the trigger 200 to actuate the switch 210 to the open state or the closed state via movement of the magnet field provided by the trigger 200 and/or the switch 210. In some examples, the movement of the body 106 toward the second position moves the trigger 200 toward the switch 210, thereby causing the trigger 200 to actuate the switch 210 via movement of the magnetic field provided by the trigger 200.

The movement of the body 106 also causes relative movement between the first magnet 202 and the second magnet 204. When the body 106 rotates from the first position to the second position, the second magnet 204 moves away from the first magnet 202. The magnetic fields of the first magnet 202 and the second magnet 204 urge the second magnet 204 toward the first magnet 202 and, thus, urge the body 106 toward the first position. As a result, after a user moves the body 106 from the first position to the second position and releases the body 106, the body 106 moves back to the first position and the switch 210 resets.

Figure 5:
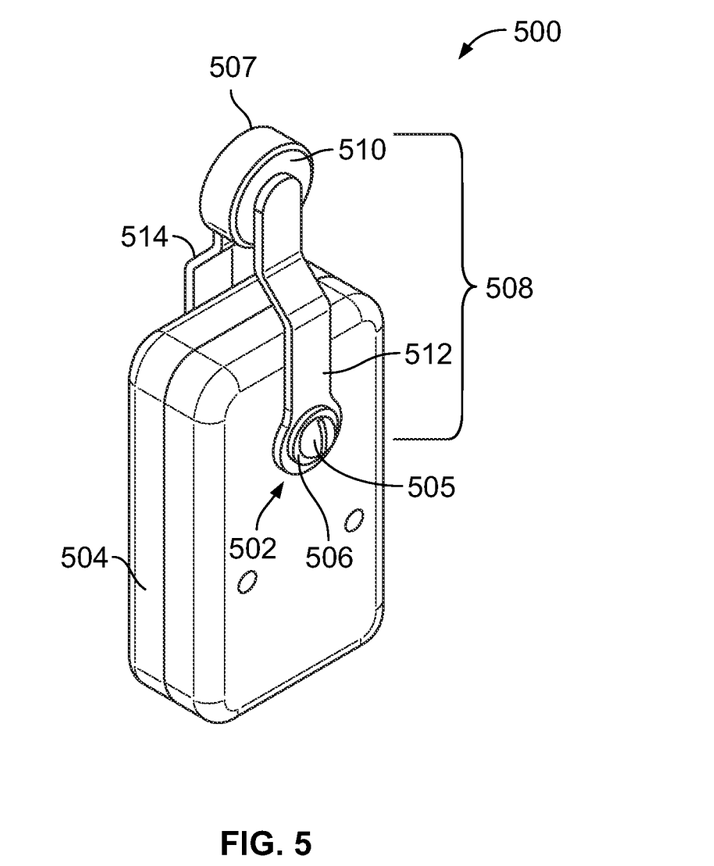
FIG. 5 illustrates another example apparatus disclosed herein.
Figure 6:
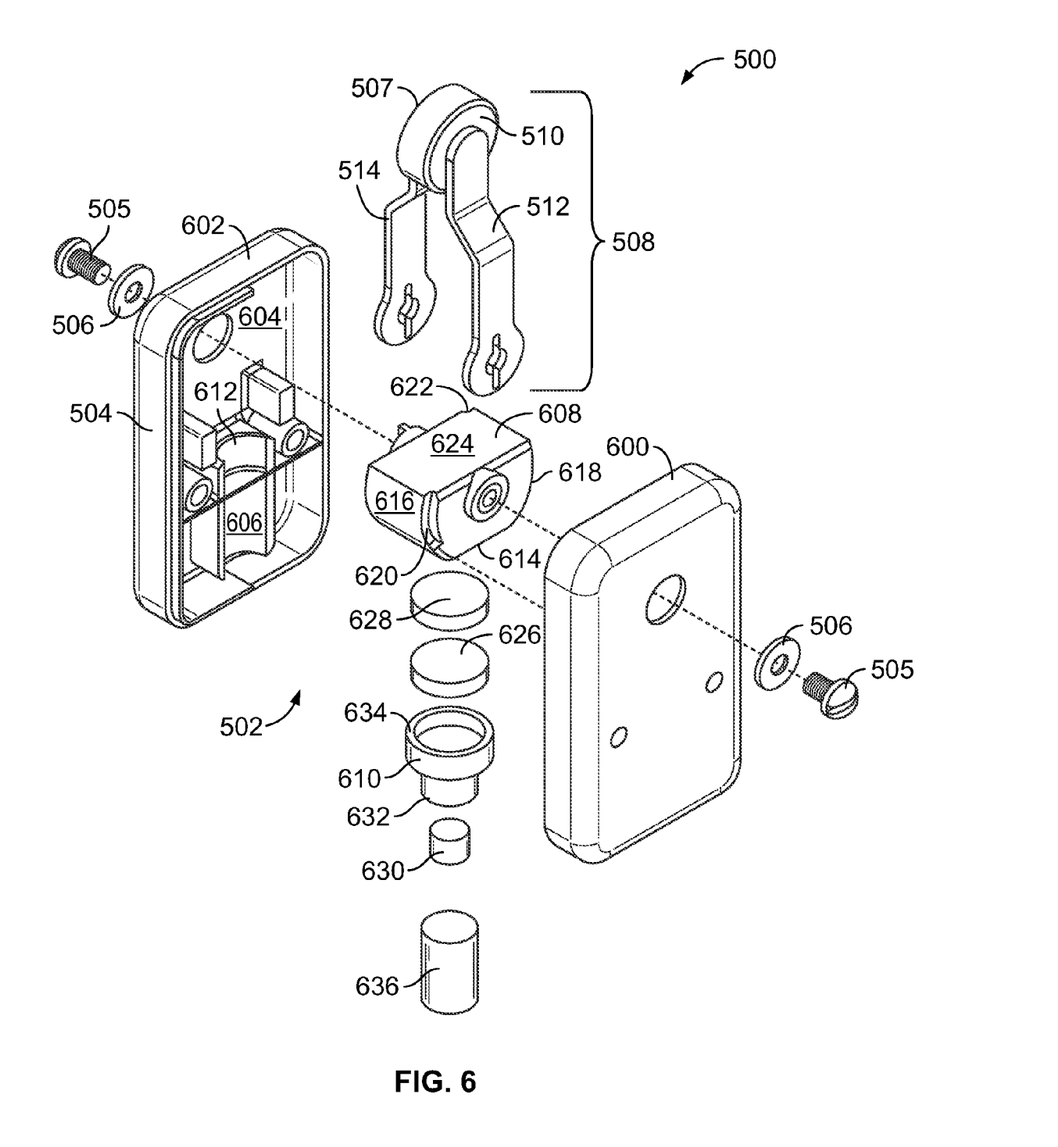
FIG. 6 depicts an exploded view of the example apparatus of FIG. 5.

FIG. 5 illustrates another example apparatus 500 disclosed herein. The example apparatus 500 includes a switch actuator assembly 502 coupled to a mount 504 via, for example, screws 505 and washers 506. In the illustrated example, the switch actuator assembly 502 includes a body 507 pivotably coupled to the mount 504. The body 507 includes a lever 508 and a cam 608 (FIG. 6). The example lever 508 includes a handle 510 (e.g., a knob, grip, roller, etc.) coupled to a pair of brackets 512 and 514. The brackets 512 and 514 are pivotably coupled to opposing sides of the mount 504.

In the illustrated example, the body 507 is in a first position. The body 507 is movable from the first position in a first direction or a second direction opposite the first direction. The mount 504 is nonmagnetic (e.g., plastic, ceramic, etc.). As described in greater detail below, when the body 507 moves from the first position to a second position, a trigger 630 (FIG. 6) actuates a switch 636 (FIG. 6) via a magnetic field.

FIG. 6 depicts an exploded view of the example apparatus 500 of FIG. 5. In the illustrated example, the mount 504 includes a first cover 600 and a second cover 602. In some examples, the first cover 600 and the second cover 602 are joined via a hermetic seal. The covers 600 and 602 define a first chamber 604 and a second chamber 606.

The cam 608 of the body 507 is disposed in the first chamber 604 and coupled to the brackets 512 and 514 of the lever 508 via the screws 505. A follower 610 is adjacent the cam 608. The follower 610 is movably coupled to the mount 504 via a slot or bore 612 in the first chamber 604. In the illustrated example, the cam 608 includes a substantially planar face 614 adjacent the follower 610 and curved faces 616 and 618 extending outwardly from the planar face 614 to define a path of the follower 610. However, the above-noted shape of the cam 608 is merely an example and, thus, other shapes may be used without departing from the scope of this disclosure.

The cam 608 includes corner grooves 620 and 622 that extend from a top face 624 of the cam 608 toward the planar face 614 of the cam 608 in the orientation of FIG. 6. The grooves 620 and 622 do not extend through the planar face 614 of the cam 608. As described in greater detail below, the grooves 620 and 622 are to receive a protrusion 700 (FIG. 7) when the cam 608 rotates to limit movement of the body 507.

The example switch actuator assembly 502 also includes a first magnet 626 (e.g., a samarium-cobalt magnet, a neodymium magnet, etc.), a second magnet 628 (e.g., a samarium-cobalt magnet, a neodymium magnet, etc.) and the trigger 630. The second magnet 628 is coupled to the cam 608. In some examples, the second magnet 628 is disposed on the planar face 614 of the cam 608. In other examples, the second magnet 628 is disposed inside the cam 608. The first magnet 626 is coupled to an end 634 of the follower 610 adjacent the cam 608. The first magnet 626 is oriented to be attracted to the second magnet 628 (e.g., a north pole of the first magnet 626 is adjacent a south pole of the second magnet 628). As a result, the cam 608 and the follower 610 are operatively coupled via magnetic fields of the first magnet 626 and the second magnet 628. The trigger 630 is also coupled to the follower 610. The trigger 630 is disposed on an end 632 of the follower 610 adjacent the second chamber 606. The trigger 630 is magnetic and/or ferrous.

The mount 504 partitions the switch 636 (e.g., a TopWorx GO® Switch, an inductive proximity switch, etc.) from the body 507. In the illustrated example, the switch 636 is enclosed in the second chamber 606 to partition or isolate the body 507 from the switch 636. The switch 636 includes a proximity sensor. As described in greater detail below, movement of the body 507 causes the trigger 630 to actuate the switch 636 via a magnetic field.

Figure 7:
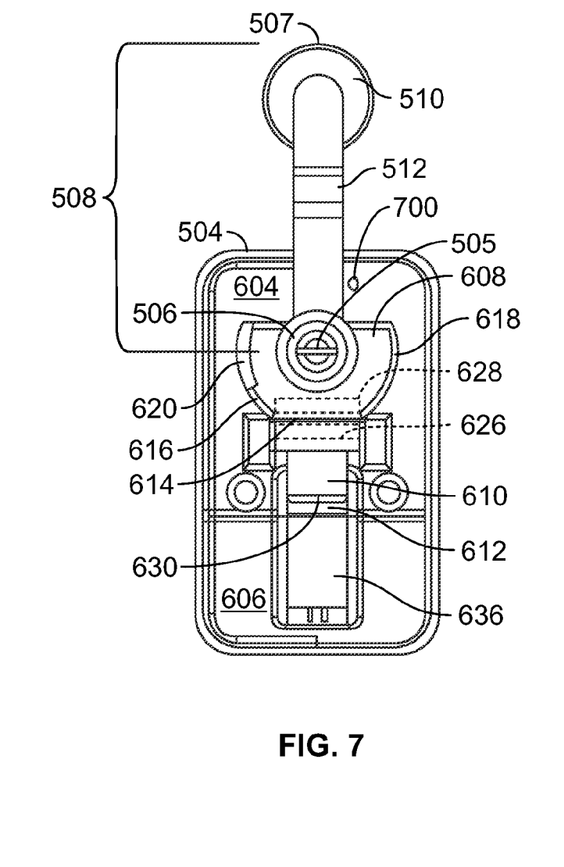
FIG. 7 illustrates the example apparatus of FIG. 5 in a first position.

FIG. 7 illustrates the example apparatus 500 of FIG. 5 in the first position. When the body 507 is in the first position, the first magnet 626 and the second magnet 628 are substantially aligned, and the follower 610 abuts the planar face 614 of the cam 608. The first and second covers 600 and 602 each include a protrusion 700 disposed in the first chamber 604 to be received in one of the slots 620 and 622 of the cam 608 to limit the movement of the body 507.

Figure 8:
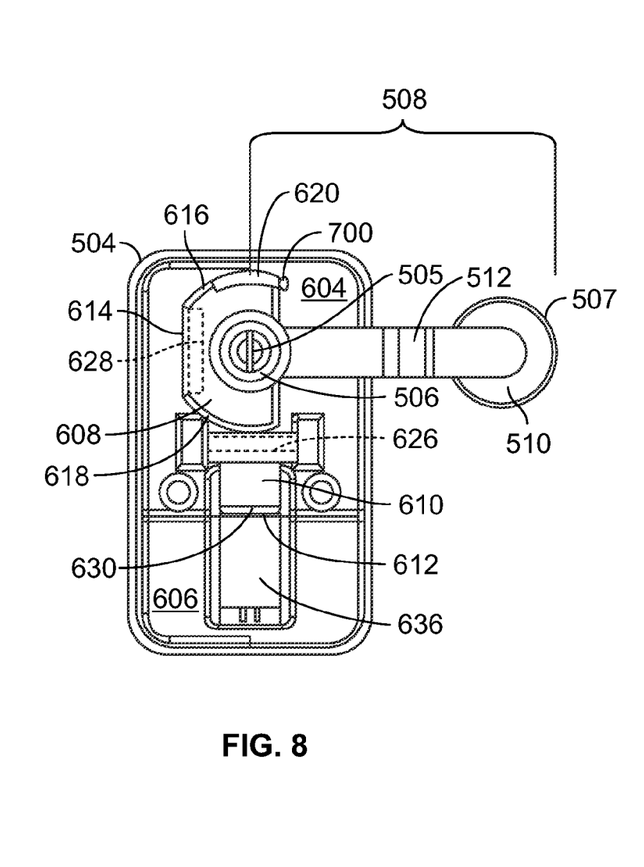
FIG. 8 illustrates the example apparatus of FIG. 5 in a second position.

FIG. 8 illustrates the example apparatus 500 of FIG. 5 in the second position. The trigger 630 is movable with the body 507 via the follower 610, and movement of the body 507 causes relative movement between the trigger 630 and the switch 636. The body 507 may rotate in the first direction or the second direction from the first position. In the illustrated example, movement of the body 507 from the first position causes the cam 608 to rotate. The magnetic fields of the first magnet 626 and the second magnet 628 cause the follower 610 to remain in contact with the cam 608 such that when the cam 608 rotates from the first position, one of the curved surfaces 616 and 618 of the cam 608 moves the follower 610 downward in the slot 612 in the orientation of FIG. 8 and, thus, moves the trigger 630 toward the switch 636. As a result, the trigger 630 actuates the switch 636 without contacting the switch 636 via a magnetic field provided by the trigger 630 and/or the switch 636.

Movement of the body 507 also causes relative movement between the first magnet 626 and the second magnet 628. When the body 507 rotates from the first position to the second position, the second magnet 628 rotates away from the first magnet 626. The magnetic fields of the first magnet 626 and the second magnet 628 urge the second magnet 628 toward the first magnet 626 and, thus, urge the body 507 toward the first position. As a result, after a user moves the body 507 from the first position to the second position and releases the body 507, the body 507 moves back to the first position via the magnetic fields, thereby moving the follower 610 upward in the orientation of FIG. 8 and causing the switch 636 to reset.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

The Abstract at the end of this disclosure is provided to comply with 37 C.F.R. §1.72(b) to allow the reader to quickly ascertain the nature of the technical disclosure. It is submitted with the understanding that it will not be used to interpret or limit the scope or meaning of the claims.

What is claimed is:

1. An apparatus, comprising:
a mount including a first magnet;
a body movably coupled to the mount, the body including a second magnet; and
a trigger movable with the body, wherein the first magnet and the second magnet urge the body toward a position, and wherein movement of the body in a first direction from the position toward a first stop is to cause the trigger to actuate a switch via a magnetic field, and movement of the body in a second direction from the position toward a second stop is to cause the trigger to actuate the switch via the magnetic field.

2. The apparatus of claim 1, wherein movement of the body is to cause relative movement between the first magnet and the second magnet and relative movement between the trigger and the switch.

3. The apparatus of claim 1, wherein the body comprises a lever and a cam.

4. The apparatus of claim 3, wherein the first magnet and the trigger are operatively coupled to the cam via a follower.

5. The apparatus of claim 1, wherein the body is elongated and the second magnet is disposed along a length of the body.

6. The apparatus of claim 5, wherein the trigger is disposed along the length of the body.

7. The apparatus of claim 1, wherein the mount partitions the body from the switch.

8. The apparatus of claim 1, wherein the switch includes a proximity sensor.

9. An apparatus, comprising:
a mount; and
a switch actuator assembly coupled to the mount, the switch actuator assembly including a body, a trigger, and a first magnet oriented to be attracted to a second magnet to urge the body toward a position, wherein movement of the body in a first direction away from the position is to cause relative movement between the first magnet and the second magnet and relative movement between the trigger and a switch, and movement of the body in a second direction away from the position is to cause relative movement between the first magnet and the second magnet and relative movement between the trigger and the switch.

10. The apparatus of claim 9, wherein movement of the body away from the position is to actuate the switch without the trigger contacting the switch, and wherein the first magnet urges the body toward the position.

11. The apparatus of claim 9, wherein the body comprises a lever and a cam.

12. The apparatus of claim 11, wherein the trigger is movable with the body via a follower adjacent the cam.

13. The apparatus of claim 12, wherein the first magnet is coupled to the follower to operatively couple the follower to the cam.

14. The apparatus of claim 9, wherein the body is elongated and the second magnet is disposed along a length of the body.

15. The apparatus of claim 14, wherein the trigger is disposed along the length of the body.

16. The apparatus of claim 9, wherein the mount partitions the body from the switch.

17. The apparatus of claim 9, wherein the switch includes a proximity sensor.

18. An apparatus, comprising:
means for actuating movably coupled to means for mounting the means for actuating, the means for mounting including first means for magnetically urging the means for actuating, the means for actuating including second means for magnetically urging the means for actuating; and
means for magnetically actuating a switch movable with the means for actuating, wherein the first means for magnetically urging and the second means for magnetically urging urge the means for actuating toward a position, and wherein movement of the means for actuating in a first direction from the position toward a first stop is to cause the means for magnetically actuating the switch to actuate the switch via a magnetic field, and movement of the means for actuating in a second direction from the position toward a second stop is to cause the means for magnetically actuating the switch to actuate the switch via the magnetic field.

19. The apparatus of claim 1, wherein the body comprises a lever.

20. The apparatus of claim 9, wherein the body is to rotate away from the position.

\* \* \* \* \*